(12) United States Patent
Vercruysse et al.

(10) Patent No.: US 12,136,678 B2
(45) Date of Patent: Nov. 5, 2024

(54) NON-RECTANGULAR GERMANIUM PHOTODETECTOR WITH ANGLED INPUT WAVEGUIDE

(71) Applicant: Ayar Labs, Inc., Santa Clara, CA (US)

(72) Inventors: Dries Vercruysse, Millbrae, CA (US); John M. Fini, Albany, CA (US)

(73) Assignee: Ayar Labs, Inc., San Jose, CA (US)

( * ) Notice: Subject to any disclaimer, the term of this patent is extended or adjusted under 35 U.S.C. 154(b) by 226 days.

(21) Appl. No.: 17/718,319

(22) Filed: Apr. 12, 2022

(65) Prior Publication Data

US 2022/0328705 A1 Oct. 13, 2022

Related U.S. Application Data

(60) Provisional application No. 63/174,471, filed on Apr. 13, 2021.

(51) Int. Cl.
*H01L 31/0232* (2014.01)
*G02B 6/42* (2006.01)
*H01L 31/109* (2006.01)

(52) U.S. Cl.
CPC ...... *H01L 31/02327* (2013.01); *G02B 6/4203* (2013.01); *H01L 31/109* (2013.01)

(58) Field of Classification Search
CPC ............ G02B 6/4203; H01L 31/02327; H01L 31/109
See application file for complete search history.

(56) References Cited

U.S. PATENT DOCUMENTS

2019/0035948 A1* 1/2019 Bayn ................ H01L 31/02325

* cited by examiner

*Primary Examiner* — Suberr L Chi
(74) *Attorney, Agent, or Firm* — Penilla IP, APC

(57) ABSTRACT

A photodetector includes a photodiode that has a germanium junction formed between an n-doped region and a p-doped region. The germanium junction is formed to have an input interface at a light input end of the germanium junction. The input interface has a substantially flat shape or a convex-faceted shape. The photodetector also includes an input waveguide connected to the input interface of the germanium junction. The input waveguide has a substantially linear shape along a lengthwise centerline of the input waveguide. The input waveguide is oriented so that the lengthwise centerline of the input waveguide is positioned at a non-zero angle relative to input interface of the germanium junction.

10 Claims, 6 Drawing Sheets

NON-RECTANGULAR GERMANIUM PHOTODETECTOR WITH ANGLED INPUT WAVEGUIDE

CLAIM OF PRIORITY

This application claims priority under 35 U.S.C. 119 to U.S. Provisional Patent Application No. 63/174,471, filed on Apr. 13, 2021, the disclosure of which is incorporated herein by reference in its entirety for all purposes.

BACKGROUND

1. Field of the Invention

The disclosed embodiments relate to optical data communication.

2. Description of the Related Art

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient devices for conveying optical signals, coupling optical signals between optical waveguides, modulating optical signals, and receiving optical signals. It is within this context that the disclosed embodiments arise.

SUMMARY

In an example embodiment, a photodetector is disclosed. The photodetector includes a photodiode that has a germanium junction formed between an n-doped region and a p-doped region. The germanium junction is formed to have an input interface at a light input end of the germanium junction. The input interface has a substantially flat shape. The photodetector also includes an input waveguide connected to the input interface of the germanium junction. The input waveguide has a substantially linear shape along a lengthwise centerline of the input waveguide. The input waveguide is oriented so that the lengthwise centerline of the input waveguide is positioned at a non-zero angle relative to a reference vector that extends perpendicular to the input interface of the germanium junction.

In an example embodiment, a photodetector is disclosed. The photodetector includes a photodiode that has a germanium junction formed between an n-doped region and a p-doped region. The germanium junction is formed to have an input interface at a light input end of the germanium junction. The input interface has a convex-faceted shape. The photodetector also includes an input waveguide connected to the input interface of the germanium junction. The input waveguide has a substantially linear shape along a lengthwise centerline of the input waveguide. The input waveguide is oriented to so that the lengthwise centerline of the input waveguide is non-perpendicular to the convex-faceted shape of the input interface of the germanium junction.

In an example embodiment, a photodetector is disclosed. The photodetector includes a photodiode that has a germanium junction formed between an n-doped region and a p-doped region. The germanium junction is formed to have a light input interface. The light input interface has a convex-faceted shape. The germanium junction has a polygonal cross-sectional shape in a reference plane between the n-doped region and the p-doped region. The polygonal cross-sectional shape includes at least one angle greater than ninety degrees.

Other aspects and advantages of the disclosed embodiments will become more apparent from the following detailed description, taken in conjunction with the accompanying drawings, illustrating by way of example the disclosed embodiments.

DETAILED DESCRIPTION

In the following description, numerous specific details are set forth in order to provide an understanding of the disclosed embodiments. It will be apparent, however, to one skilled in the art that the disclosed embodiments may be practiced without some or all of these specific details. In other instances, well known process operations have not been described in detail in order not to unnecessarily obscure the disclosed embodiments.

Photodetectors play a key role in integrated photonics as they convert optical signals into electrical signals. Most photodetectors are constructed by forming a photodiode with an optical guiding structure in the junction of the photodiode. Photons absorbed in the junction of the photodiode form electron-hole pairs, which result in electrical current referred to as photocurrent. Silicon absorbs little light in the frequency range of light that is used for data transmission in telecommunication applications, because the bandgap of silicon is larger than the photon energy in that frequency range. Therefore, photodetectors used in silicon photonics often use germanium as the material for the junction of the photodiode, because germanium has a band gap below optical frequencies and thus provides a good photon absorber for creating electron-hole pairs and generating corresponding photocurrent. Therefore, vertical or lateral hetero-junctions formed by silicon and germanium are used in photodiodes for silicon photonics applications, such as for data transmission in telecommunication applications.

Figure 1:
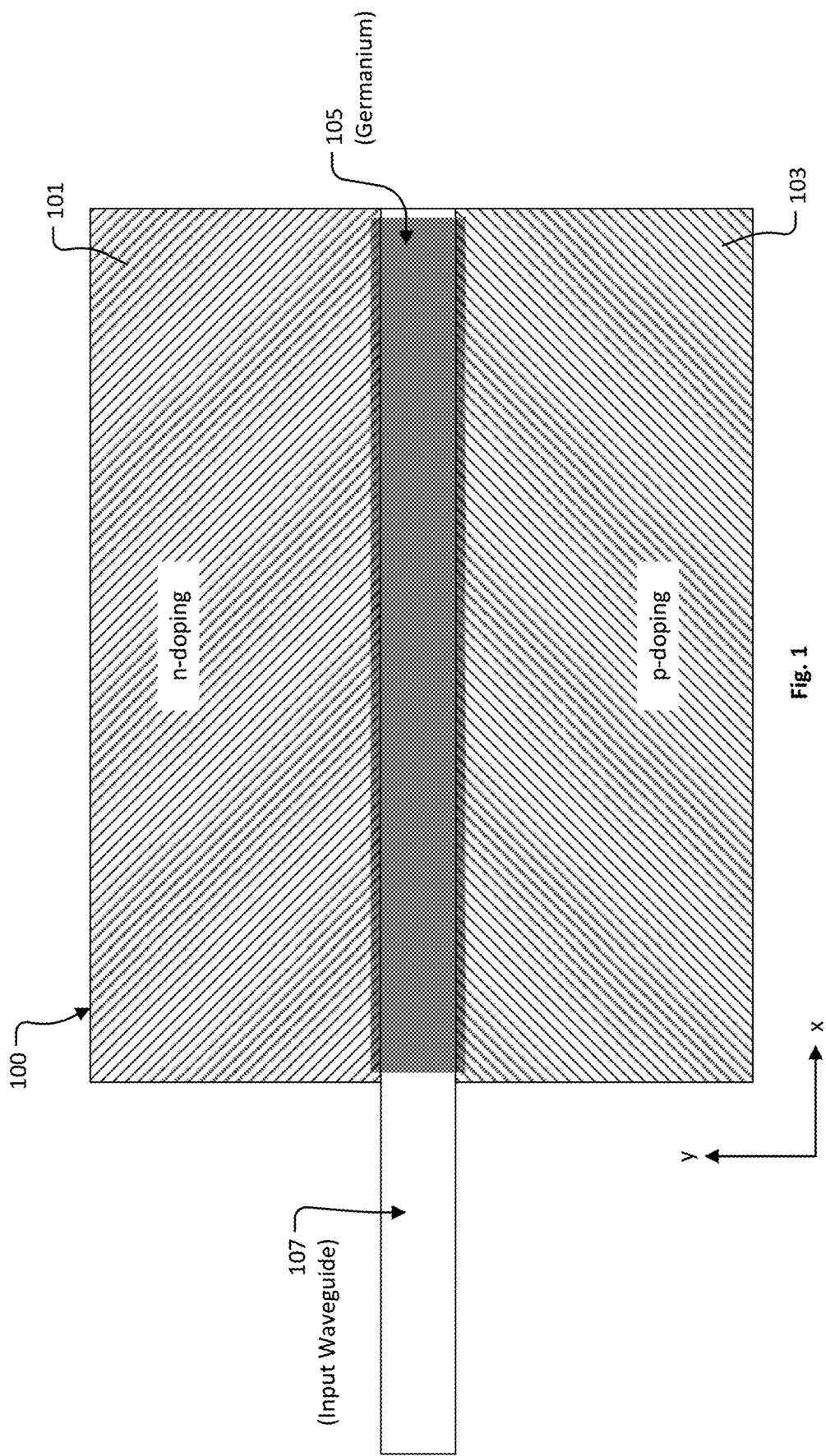
FIG. 1 shows a photodiode, in accordance with some embodiments.

FIG. 1 shows a photodiode 100, in accordance with some embodiments. The photodiode 100 includes a junction 105 formed as a long rectangular germanium strip in silicon, in line with a silicon input waveguide 107. The photodiode 100 also includes an n-doped region 101 formed in silicon on a first side of the junction 105, and a p-doped region 103 formed in silicon on a second side of the junction 105. In the case of a lateral hetero-junction, the silicon and part of the germanium at the first and second sides of the germanium strip junction 105 are n-doped and p-doped, respectively, to form the photodiode 100. The example photodiode 100 can be implemented as a photodetector in silicon photonics applications.

In constructing a photodetector, one concern is the responsivity of the photodetector, where the responsivity corresponds to the optical-to-electrical conversion efficiency of the photodetector. Also, in constructing a photodetector, another concern is the electrical capacitance of the photodiode, which will determine the operating bandwidth of the corresponding photonic device within the optical portion of the electromagnetic spectrum. Also, in constructing a photodetector, another concern is dark current which can form a noise floor of a silicon photonics application, where the dark current corresponds to an electrical signal of the photodiode that exists without any optical signal input to the photodiode. Also, in constructing a photodetector, another concern is optical reflection in which part of the incoming optical signal is reflected at the photodetector input, which can be detrimental to the optical performance of the photonic system.

Various embodiments of photodetectors and photodiodes are disclosed herein that provide improvements over the in-line germanium strip-type photodetector device geometry as shown in FIG. 1. The photodetector/photodiode embodiments disclosed herein can be made smaller, so as to reduce the capacitance of the photodetector, reduce the dark current of the photodetector, and reduce the footprint (size) of the photodetector on the chip. While reducing the size of the photodetector may cause a reduction in the responsivity of the photodetector, the various photodetector/photodiode embodiments disclosed herein mitigate such a reduction in responsivity, while also reducing light reflection at the photodetector input (at the interface between the input waveguide and the junction of the photodiode).

Figure 2:
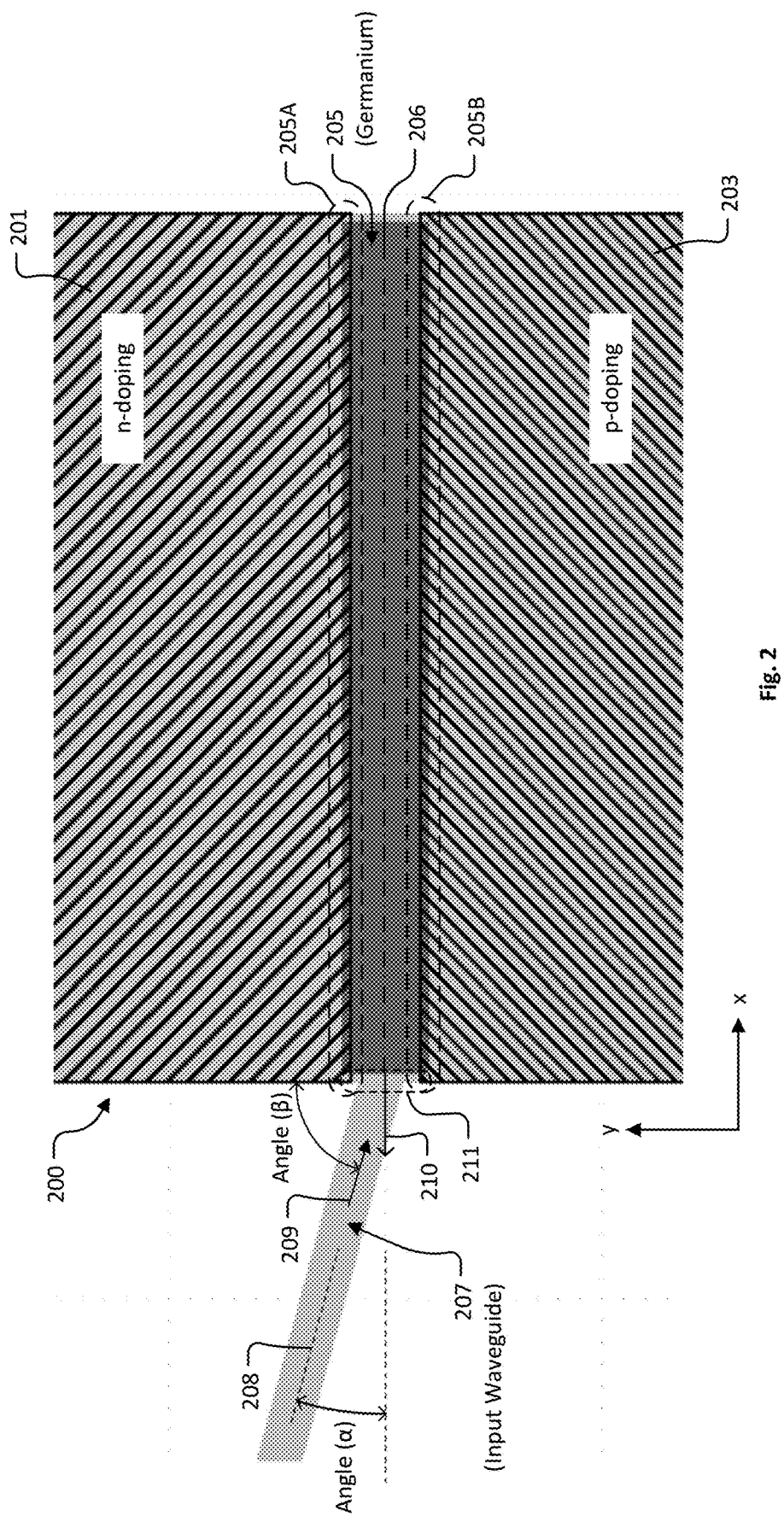
FIG. 2 shows a photodetector that includes a photodiode and an input waveguide coupled to the photodiode at an angle ($\alpha$), in accordance with some embodiments.

FIG. 2 shows a photodetector that includes a photodiode 200 and an input waveguide 207 coupled to the photodiode 200 at an angle ($\alpha$), in accordance with some embodiments. The photodiode 200 includes a junction 205 formed as a germanium strip in silicon. In some embodiments, the germanium strip is substantially rectangular. The photodiode 200 also includes an n-doped region 201 formed in silicon on a first side of the junction 205, and a p-doped region 203 formed in silicon on a second side of the junction 205. In the case of a lateral hetero-junction, the silicon and part of the germanium at a first side 205A of the germanium strip are n-doped to form the photodiode 200. Also, the silicon and part of the germanium at a second side 205B of the germanium strip are p-doped to form the photodiode 200. The example photodiode 200 can be implemented as a photodetector in silicon photonics applications. The input waveguide 207 of the photodetector is oriented at the angle ($\alpha$) with respect to a reference vector 210 that is oriented normal (perpendicular) to the light input interface 211 of the germanium junction 205. In this manner, the interface between the input waveguide 207 and the germanium junction 205 is oriented at an angle ($\beta$) that is non-perpendicular to a direction 209 of light propagation through the input waveguide 207 at the light input interface 211 of the germanium junction 205, which reduces light reflection back into the input waveguide 207 from the light input interface 211 of the germanium junction 205. In various embodiments, the optimum angle ($\alpha$) depends on the geometry of the germanium junction 205. In various embodiments, the optimum angle ($\alpha$) is within a range extending from about 5 degrees to about 40 degrees in either direction (either toward the n-doped region 201 of the photodiode 200 or toward the p-doped region 203 of the photodiode 200).

In an example embodiment, the photodiode 200 is implemented in a photodetector. The photodiode 200 has the germanium junction 205 formed between the n-doped region 301 and the p-doped region 203. In some embodiments, the germanium junction 205 has the substantially linear shape along a lengthwise centerline 206 of the germanium junction 205. The germanium junction 205 is formed to have the input interface 211 at the light input end of the germanium junction 205. The input interface 211 has a substantially flat shape. The photodiode 200 also includes the input waveguide 207 connected to the input interface 211 of the germanium junction 205. The input waveguide 207 has a substantially linear shape along a lengthwise centerline 208 of the input waveguide 207. The input waveguide 207 is oriented so that the lengthwise centerline 208 of the input waveguide 207 is positioned at a non-zero angle relative to the reference vector 210 that extends perpendicular to the input interface 211 of the germanium junction 205. In some embodiments, the reference vector 210 extends outward from the input interface 211 of the germanium junction 205 toward the input waveguide 207, and the non-zero angle ($\alpha$) is within a range extending from about 5 degrees to about 40 degrees. In some embodiments, the angle ($\beta$) extending between the lengthwise centerline 208 of the input waveguide 207 and the n-doped region 201 is less than the angle extending between the lengthwise centerline 208 of the input waveguide 207 and the p-doped region 203. In some embodiments, the angle ($\beta$) extending between the lengthwise centerline 208 of the input waveguide 207 and the n-doped region 201 is greater than the angle extending between the lengthwise centerline 208 of the input waveguide 207 and the p-doped region 203.

Figure 3A:
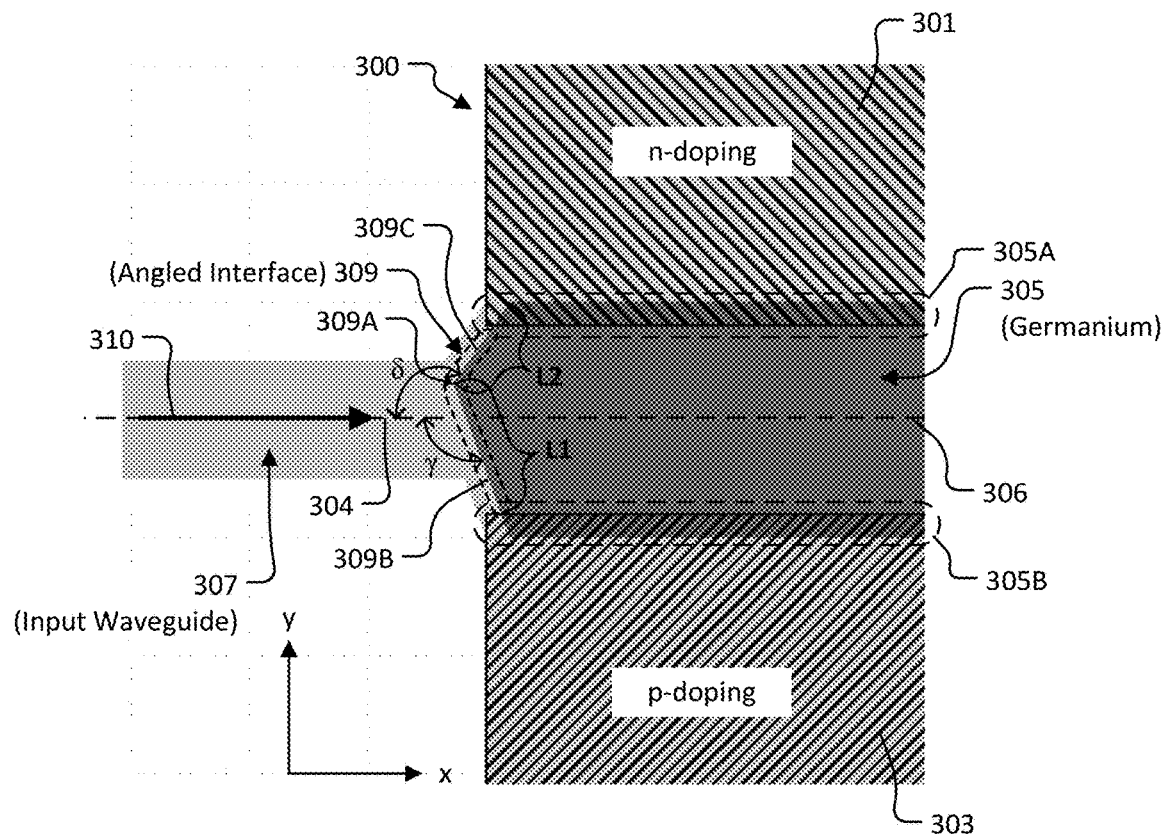
FIG. 3A shows a photodetector that includes a photodiode and an input waveguide coupled to the photodiode, with an angled interface between the input waveguide and the photodiode, in accordance with some embodiments.

FIG. 3A shows a photodetector that includes a photodiode 300 and an input waveguide 307 coupled to the photodiode 300, with an angled interface 309 between the input waveguide 307 and the photodiode 300, in accordance with some embodiments. The photodiode 300 includes a junction 305 formed as a germanium strip in silicon. In some embodiments, the germanium junction 305 is substantially linear-shaped except for the angled interface 309 at the light input end of the germanium junction 305 that is coupled to the input waveguide 307. The germanium junction 305 has a lengthwise centerline 306. The photodiode 300 also includes an n-doped region 301 formed in silicon on a first side of the junction 305, and a p-doped region 303 formed in silicon on a second side of the junction 305. In the case of a lateral hetero-junction, the silicon and part of the germanium at a first side 305A of the germanium junction 305 are n-doped to form the photodiode 300. Also, the silicon and part of the germanium at a second side 305B of the germanium junction 305 are p-doped to form the photodiode 300. The example photodiode 300 can be implemented as a photodetector in silicon photonics applications.

The angled interface 309 at the light input end of the germanium junction 305 is configured such that the angled interface 309 is not oriented perpendicular to a direction 310 of light propagation through the input waveguide 307 at the light input interface 309 of the germanium junction 305, which reduces light reflection back into the input waveguide 307 from the light input interface 309 of the germanium junction 305. In this manner, a non-flat interface 309 exists between the germanium junction 305 and the input waveguide 307 to reduce light reflection back into the input waveguide 307 from the germanium junction 305. In some embodiments, the angled interface 309 between the germanium junction 305 and the input waveguide 307 includes a sharp corner 309A, such as shown in FIG. 3A. For example, in some embodiments, the angled interface 309 between the germanium junction 305 and the input waveguide 307 is conical-shaped, pyramidal-shaped, or chevron-shaped with the apex of the conical shape, pyramid shape, or chevron shape corresponding to the sharp corner 309A positioned toward the input waveguide 307. In some embodiments, the angled interface 309 between the germanium junction 305 and the input waveguide 307 has a more rounded shape, such as formed by having additional facets.

In some embodiments, the portion of the input waveguide 307 that approaches and couples to the photodiode 300 is substantially linear-shaped and has a lengthwise centerline 304. In some embodiments, the lengthwise centerline 304 corresponds to the direction 310 of light propagation through the input waveguide 307. In some embodiments, such as shown in FIG. 3A, the lengthwise centerline 304 of the input waveguide 307 is oriented substantially parallel to the lengthwise centerline 306 of the germanium junction 305. In some embodiments, such as shown in FIG. 3A, the lengthwise centerline 304 of the input waveguide 307 is substantially co-aligned with the lengthwise centerline 306 of the germanium junction 305. In some embodiments, the angled input interface 309 is configured to have a first angled side 309B that is oriented at angle ($\gamma$) relative to the lengthwise centerline 304 of the input waveguide 307. The angled input interface 309 is also configured to have a second angled side 309C that is oriented at angle ($\delta$) relative to the lengthwise centerline 304 of the input waveguide 307. In some embodiments, both of the angles ($\gamma$) and ($\delta$) are greater than 90 degrees. In some embodiments, the angles ($\gamma$) and ($\delta$) are substantially the same. In some embodiments, the angles ($\gamma$) and ($\delta$) are different.

In some embodiments, such as shown in FIG. 3A, the first angled side 309B has a length L1 that is longer than a length L2 of the second angled side 309C, where the length L1 of the first angled side 309B and the length L2 of the second angled side 309C are measured within an x-y reference plane that extends perpendicular to both the first side 305A and the second side 305B of the germanium junction 305 and that extends parallel to the direction 310 of light propagation through the input waveguide 307. In some other embodiments, the length L2 of the second angled side 309C is longer than the length L1 of the first angled side 309B. Also, in some other embodiments, the first angled side 309B and the second angled side 309C have substantially the same length, e.g., L1=L2. In some embodiments, such as shown in FIG. 3A, the input waveguide 307 is positioned in the y-reference direction relative to the photodiode 300 such that a center of a fundamental optical mode of the input waveguide 307 is spatially offset from the sharp corner 309A between the first angled side 309B and the second angled side 309C of the angled input interface 309. In some embodiments, such as shown in FIG. 3A, the input waveguide 307 is positioned in the y-reference direction relative to the photodiode 300 such that a center of the fundamental optical mode of the input waveguide 307 is substantially spatially centered on the lengthwise centerline 306 of the germanium junction 305 while also being spatially offset from the sharp corner 309A between the first angled side 309B and the second angled side 309C of the angled input interface 309 due to the difference in lengths L1 and L2 between the first and second angled sides 309B and 309C, respectively. However, in some other embodiments, the input waveguide 307 is positioned in the y-reference direction such that the center of the fundamental optical mode of the input waveguide 307 is substantially spatially centered on the sharp corner 309A between the first angled side 309B and the second angled side 309C of the angled input interface 309.

Figure 3B:
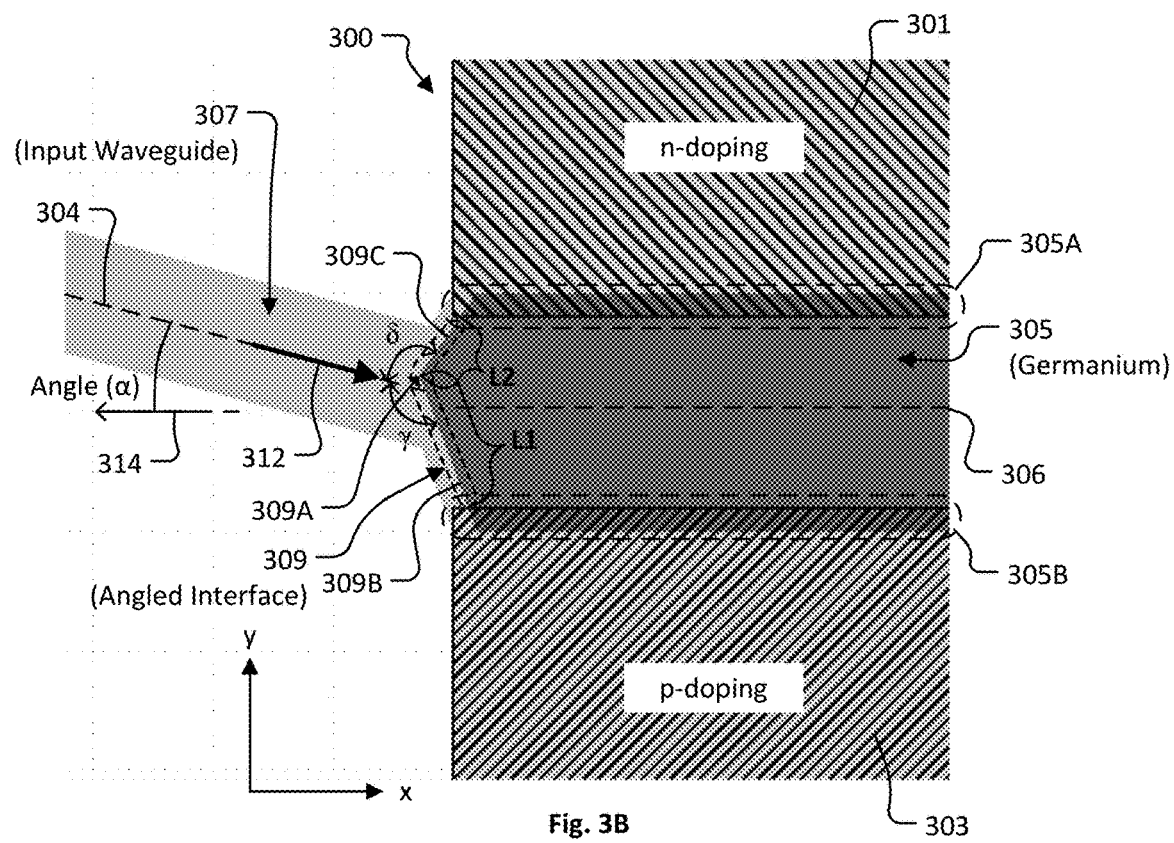
FIG. 3B shows the photodiode of FIG. 3A with the input waveguide coupled to the photodiode at an angle ($\alpha$), in accordance with some embodiments.

FIG. 3B shows the photodiode 300 of FIG. 3A with the input waveguide 307 coupled to the photodiode 300 at an angle ($\alpha$), in accordance with some embodiments. The input waveguide 307 of the photodetector is oriented at the angle ($\alpha$) with respect to a reference vector 314 that is oriented parallel to the lengthwise centerline 306 of the germanium junction 305. In this manner, the interface between the input waveguide 307 and the germanium junction 305 is angled non-perpendicular to a direction 312 of light propagation through the input waveguide 307 at the light input interface 309 of the germanium junction 305, which reduces light reflection back into the input waveguide 307 from the light input interface 309 of the germanium junction 305. In various embodiments, the optimum angle ($\alpha$) depends on the geometry of the germanium junction 305 and/or the shape of the angled interface 309 between the germanium junction 305 and the input waveguide 307. In various embodiments, the optimum angle ($\alpha$) is within a range extending from about 5 degrees to about 40 degrees in either direction (either toward the n-doped region 301 of the photodiode 300 or toward the p-doped region 303 of the photodiode 300). In comparison with the photodiode 300 configuration of FIG. 3A, the photodiode 300 configuration of FIG. 3B has a larger angle ($\gamma$) between the lengthwise centerline 304 of the input waveguide 307 and the first angled side 309B of the angled input interface 309. Also, in comparison with the photodiode 300 configuration of FIG. 3A, the photodiode 300 configuration of FIG. 3B has a smaller angle ($\delta$) between the lengthwise centerline 304 of the input waveguide 307 and the second angled side 309C of the angled input interface 309. In some embodiments, as with the photodiode 300 configuration of FIG. 3A, the input waveguide 307 in the photodiode configuration of FIG. 3B is positioned in the y-reference direction relative to the photodiode 300 such that a center of a fundamental optical mode of the input waveguide 307 is spatially offset from the sharp corner 309A between the first angled side 309B and the second angled side 309C of the angled input interface 309. However, in some other embodiments, the input waveguide 307 in the photodiode configuration of FIG. 3B is positioned in the y-reference direction such that the center of the fundamental optical mode of the input waveguide 307 is substantially spatially centered on the sharp corner 309A between the first angled side 309B and the second angled side 309C of the angled input interface 309.

In an example embodiment, the photodiode 300 is implemented in a photodetector. The photodiode 300 has the germanium junction 305 formed between the n-doped region 301 and the p-doped region 303. In some embodiments, the germanium junction 305 has the substantially linear shape along the lengthwise centerline 306 of the germanium junction 305. The germanium junction 305 is formed to have the input interface 309 at a light input end of the germanium junction 305. The input interface 309 has a convex-faceted shape.

The photodetector also includes the input waveguide 307 connected to the input interface 309 of the germanium junction 305. The input waveguide 307 has the substantially linear shape along the lengthwise centerline 304 of the input waveguide 307. The input waveguide 307 is oriented to so that the lengthwise centerline 304 of the input waveguide 307 is non-perpendicular to the convex-faceted shape of the input interface 309 of the germanium junction 305. In some embodiments, the input waveguide 307 is oriented to have the lengthwise centerline 304 of the input waveguide 307 substantially co-aligned with the lengthwise centerline 306 of the germanium junction 305. In some embodiments, the input waveguide 307 is oriented to have the non-zero angle ($\alpha$) between the lengthwise centerline 304 of the input waveguide 307 and the lengthwise centerline 306 of the germanium junction 305.

In some embodiments, the convex-faceted shape of the input interface 309 of the germanium junction 305 includes two facets, i.e., the first angled side 309B and the second angled side 309C. In some embodiments, the first facet 309B of the two facets has the first length L1 as measured in the reference plane between the n-doped region 301 and the p-doped region 303, and the second facet 309C of the two facets has the second length L2 as measured in the reference plane, where the first length L1 is greater than the second length L2. In some embodiments, the lengthwise centerline 304 of the input waveguide 307 is offset in the reference plane from the intersection point 309A of the two facets. In some embodiments, the lengthwise centerline 304 of the input waveguide 307 intersects the first facet 309B.

Figure 4:
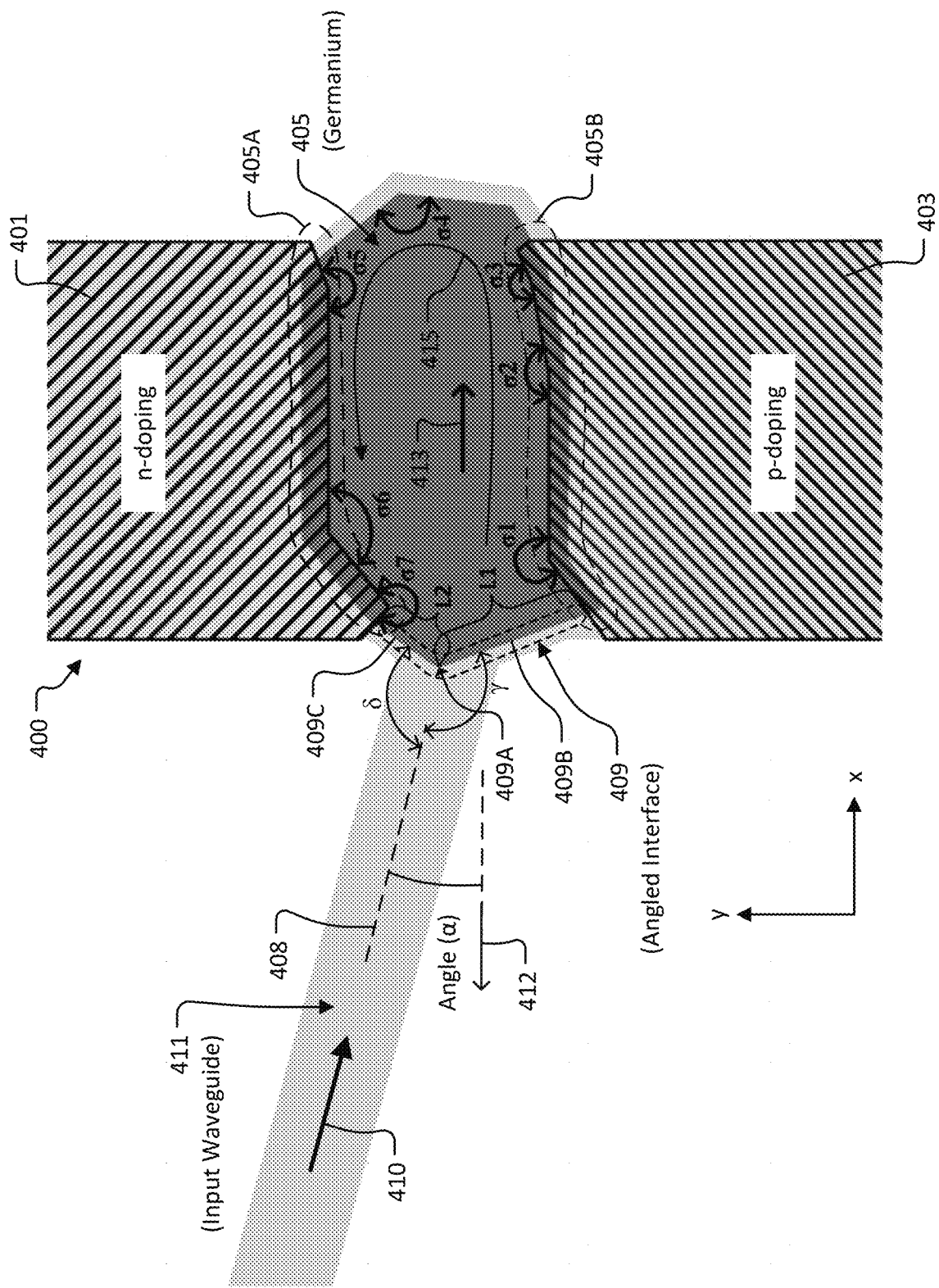
FIG. 4 shows a photodetector that includes a photodiode and an input waveguide coupled to the photodiode, where the photodiode includes a non-rectangular-shaped germanium junction, in accordance with some embodiments.

FIG. 4 shows a photodetector that includes a photodiode 400 and an input waveguide 411 coupled to the photodiode 400, where the photodiode 400 includes a non-rectangular-shaped germanium junction 405, in accordance with some embodiments. The photodiode 400 also includes an n-doped region 401 formed in silicon on a first side of the junction 405, and a p-doped region 403 formed in silicon on a second side of the junction 405. In the case of a lateral heterojunction, the silicon and part of the germanium a first side interface 405A of the germanium junction 405 is n-doped to form the photodiode 400. Also, the silicon and part of the germanium on a second side interface 405B of the germanium junction 405 is p-doped to form the photodiode 400. The example photodiode 400 can be implemented as a photodetector in silicon photonics applications.

The germanium junction 405 includes an angled interface 409 at the light input end of the germanium junction 405 that is coupled to the input waveguide 411. The angled interface 409 at the light input end of the germanium junction 405 is configured such that the angled interface 409 is not oriented perpendicular a direction 410 of light propagation through the input waveguide 411 at the input interface of the germanium junction 405, which reduces light reflection back into the input waveguide 411 from the input interface 409 of the germanium junction 405. In this manner, a non-flat interface 409 exists between the germanium junction 405 and the input waveguide 411 to reduce light reflection back into the input waveguide 411 from the germanium junction 405. In some embodiments, the angled interface 409 between the germanium junction 405 and the input waveguide 411 includes a sharp corner 409A. For example, in some embodiments, the angled interface 409 between the germanium junction 405 and the input waveguide 411 is conical-shaped, pyramidal-shaped, or chevron-shaped with the apex of the conical shape, pyramid shape, or chevron shape corresponding to the sharp corner 409A positioned toward the input waveguide 411. In some embodiments, the angled interface 409 between the germanium junction 405 and the input waveguide 411 has a more rounded shape, such as formed by having additional facets.

The input waveguide 411 of the photodetector is oriented at an angle ($\alpha$) with respect to a reference vector 412. In some embodiments, the reference vector 412 is oriented substantially parallel to a dominant direction of light propagation 413 within the germanium junction 405. In this manner, the interface 409 between the input waveguide 411 and the germanium junction 405 is angled non-perpendicular to the direction 410 of light propagation through the input waveguide 411 at the light input interface 409 of the germanium junction 405, which reduces light reflection back into the input waveguide 411 from the light input interface 409 of the germanium junction 405. In various embodiments, the optimum angle ($\alpha$) depends on the geometry of the germanium junction 405 and/or the shape of the angled interface 409 between the germanium junction 405 and the input waveguide 411. In various embodiments, the optimum angle ($\alpha$) is within a range extending from about 5 degrees to about 40 degrees in either direction (either toward the n-doped region 401 of the photodiode 400 or toward the p-doped region 403 of the photodiode 400).

In some embodiments, the portion of the input waveguide 411 that approaches and couples to the photodiode 400 is substantially linear-shaped and has a lengthwise centerline 408. In some embodiments, the lengthwise centerline 408 corresponds to the direction 410 of light propagation through the input waveguide 411. In some embodiments, the angled input interface 409 is configured to have a first angled side 409B that is oriented at angle ($\gamma$) relative to the lengthwise centerline 408 of the input waveguide 411. The angled input interface 409 is also configured to have a second angled side 409C that is oriented at angle ($\delta$) relative to the lengthwise centerline 408 of the input waveguide 411. In some embodiments, both of the angles ($\gamma$) and ($\delta$) are greater than 90 degrees. In some embodiments, the angles ($\gamma$) and ($\delta$) are substantially the same. In some embodiments, the angles ($\gamma$) and ($\delta$) are different.

In some embodiments, the first angled side 409B has a length L1 that is longer than a length L2 of the second angled side 409C, where the length L1 of the first angled side 409B and the length L2 of the second angled side 409C are measured within an x-y reference plane. In some other embodiments, the length L2 of the second angled side 409C is longer than the length L1 of the first angled side 409B. Also, in some other embodiments, the first angled side 409B and the second angled side 409C have substantially the same length, e.g., L1=L2. In some embodiments, the input waveguide 411 is positioned in the y-reference direction relative to the photodiode 400 such that a center of a fundamental optical mode of the input waveguide 411 is spatially offset from the sharp corner 409A between the first angled side 409B and the second angled side 409C of the angled input interface 409. However, in some other embodiments, the input waveguide 411 is positioned in the y-reference direction such that the center of the fundamental optical mode of the input waveguide 411 is substantially spatially centered on the sharp corner 409A between the first angled side 409B and the second angled side 409C of the angled input interface 409.

In some embodiments, a perimeter of the germanium junction 405 in an x-y reference plane cross-section parallel to the chip substrate is approximately polygonal-shaped, such as shown in FIG. 4, to include multiple angled interfaces/facets that assist with increasing a travel length of the light within the germanium junction 405, which provides for more absorption of light within the germanium junction 405 and a corresponding increases the responsivity of the photodiode 400. For example, the germanium junction 405 in vertical cross-section has multiple peripheral facets defined by multiple facet-to-facet angles ($\sigma 1$) to ($\sigma 7$). It should be understood that the number, size, shape, and relative locations of the multiple facet-to-facet angles ($\sigma 1$) to ($\sigma 7$) in the photodiode 400 example of FIG. 4 are shown an examples. In various embodiments, the number (N), size, shape, and relative locations of the multiple facet-to-facet angles, e.g., ($\sigma 1$) to ($\sigma N$) are defined as needed to assist in directing the light received from the input waveguide 411 around the germanium junction 405 so that the length of the path traveled by the light within the germanium junction 405 is increased, and preferably maximized. In some embodiments, the path traveled by the light within the germanium junction 405 is guided around the periphery of the germanium junction 405 in the x-y reference plane cross-section, such as indicated by the arrow 415.

In some embodiments, the approximate polygonal-shaped perimeter of the germanium junction 405 in the x-y reference plane cross-section has at least one of the angles ($\sigma 1$) to ($\sigma N$) between adjacent interfaces/facets that is substantially different from 90 degrees. For example, the photodiode 400 of FIG. 4 includes the angle ($\sigma 6$) between adjacent interface/facets that is substantially different from 90 degrees. In some embodiments, the one or more obtuse angles, such as angle ($\sigma 6$), is/are within a range extending from about 110 degrees to about 160 degrees. In some embodiments, at least one of the obtuse angles, such as angle ($\sigma 6$), is positioned to overlap with the optical mode entering the germanium junction 405 from the input waveguide 411. Also, in some embodiments, some sharp (acute) angles can exist between some of the adjacent interfaces/facets along the polygonal-shaped perimeter of the germanium junction 405 in the x-y reference plane cross-section. In some embodiments, the perimeter of the germanium junction 405 in the x-y reference plane cross-section is more rounded or more oval-shaped, such as by having more obtuse angles ($\sigma 1$) to ($\sigma N$) between some of the adjacent interfaces/facets along the perimeter of the germanium junction 405 and/or by having more interface/facets along the perimeter of the germanium junction 405.

Longer photodiode structures have an advantage of absorbing nearly all input light. However, with increased length of the photodiode structure, both the dark current and capacitance of the photodiode adversely increases. The non-rectangular-shaped germanium junction 405 of the photodiode 400 enables the photodiode 400 to be shorter in the x-direction, which provides for reduced dark current and capacitance of the photodiode 400. In some embodiments, a size of the non-rectangular-shaped germanium junction 405 of the photodiode 400 in the x-direction is within a range extending from about 1.5 micrometers to about 10 micrometers, which is smaller than x-direction size of about 15 micrometers for the linear-shaped photodiode 100 of FIG. 1. Also, the non-rectangular-shaped germanium junction 405 of the photodiode 400 mitigates loss in responsivity by increasing the travel distance of light within the germanium junction 405.

Figure 5A:
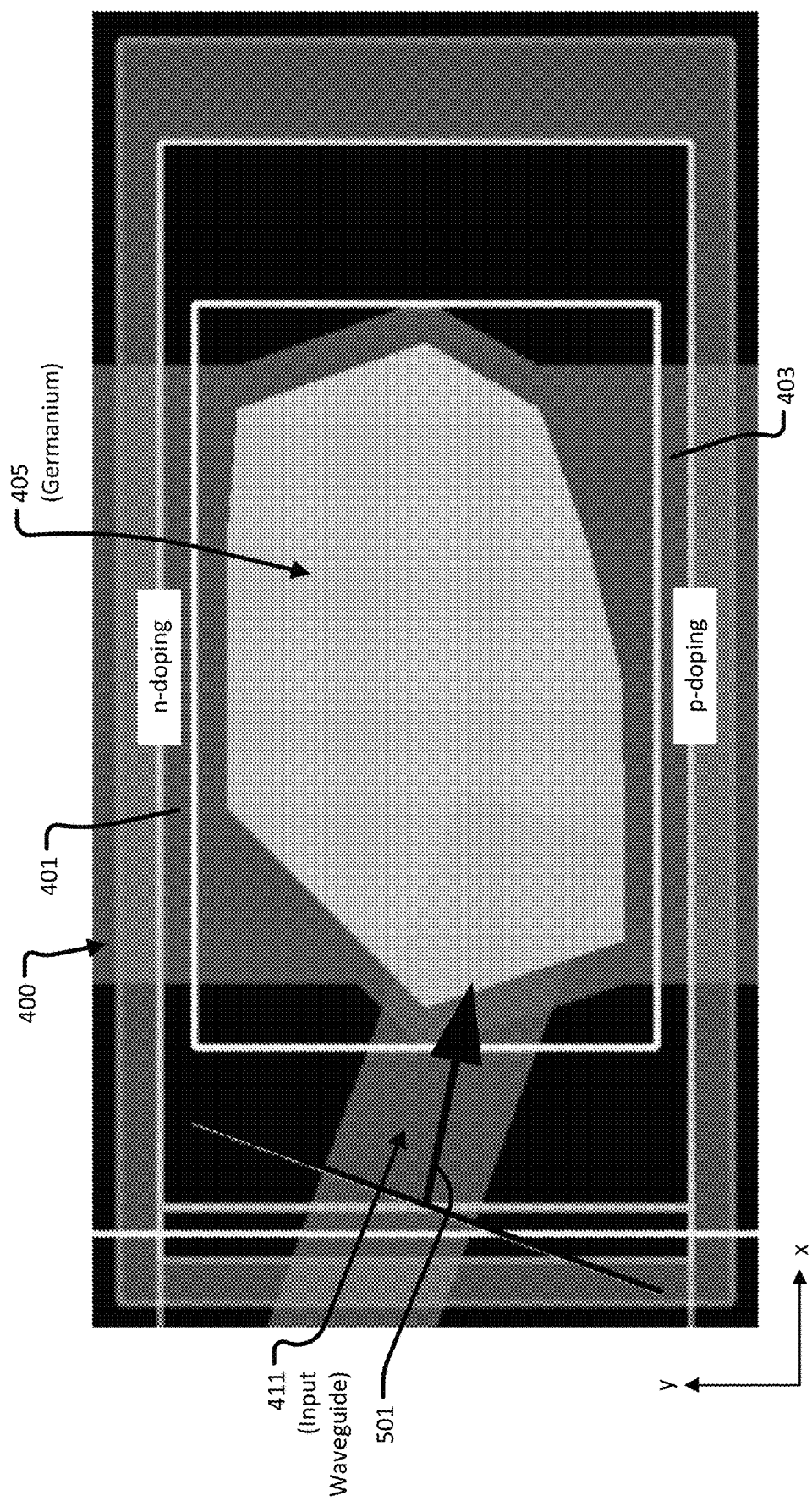
FIG. 5A shows a simulation model of the photodetector of FIG. 4 having the photodiode and the input waveguide, in accordance with some embodiments.
Figure 5B:
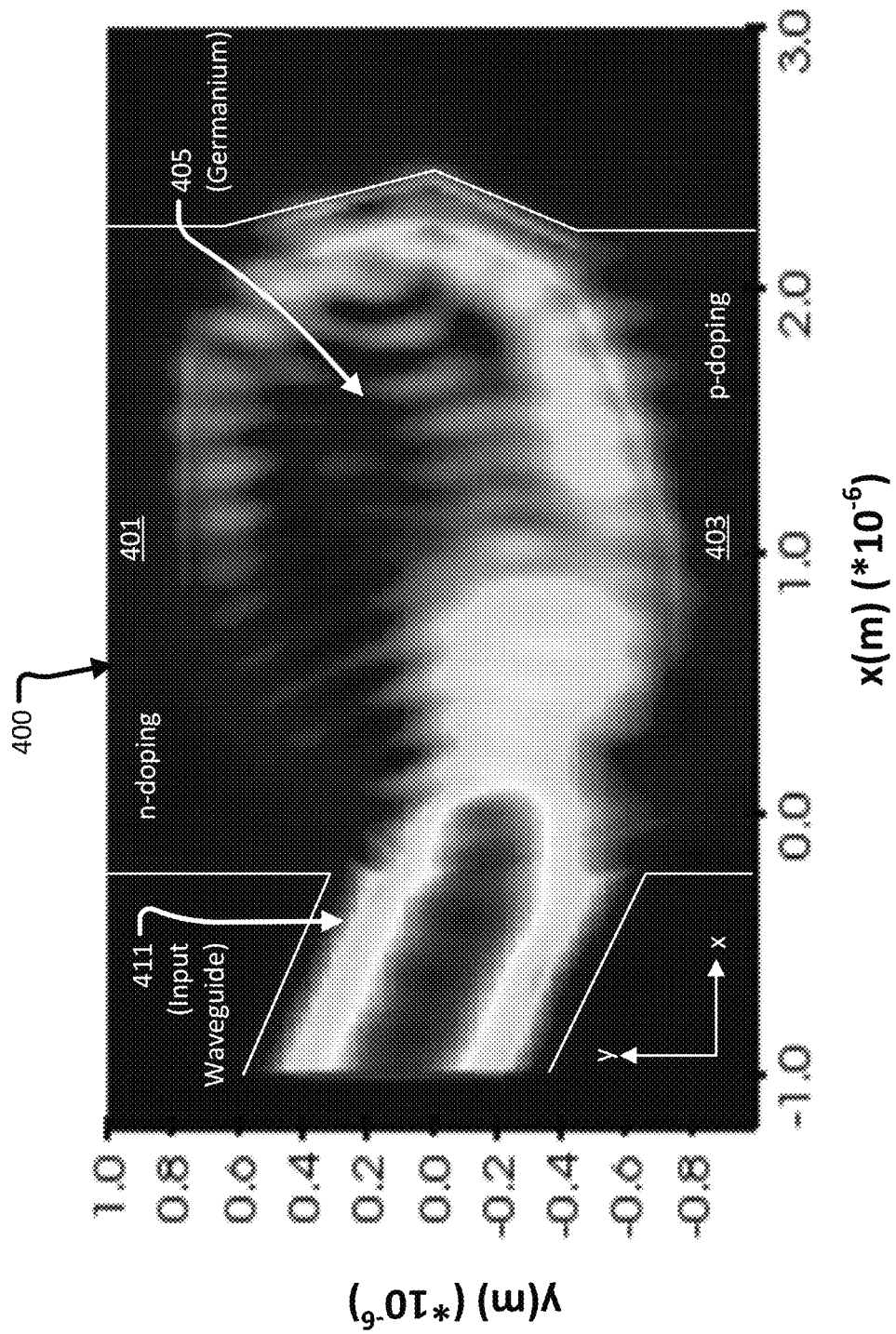
FIG. 5B shows simulated optical fields within the photodetector of FIG. 4 having the photodiode and the input waveguide for the simulation model as shown in FIG. 5A, in accordance with some embodiments.

FIG. 5A shows a simulation model of the photodetector of FIG. 4 having the photodiode 400 and the input waveguide 411, in accordance with some embodiments. Light is injected through the input waveguide 411 into the germanium junction 405, as indicated by arrow 501. FIG. 5B shows simulated optical fields within the photodetector of FIG. 4 having the photodiode 400 and the input waveguide 411 for the simulation model as shown in FIG. 5A, in accordance with some embodiments. In the simulation model of FIGS. 5A and 5B, the angle ($\alpha$) of the input waveguide 411 is 20 degrees. As described with regard to FIG. 4, the germanium junction 405 has the non-rectangular perimeter geometry in the x-y reference plane cross-section and the non-flat interface (angled interface 409) with the input waveguide 411. FIG. 5B shows the electrical field magnitude of a finite-difference time-domain (FDTD) electromagnetic simulation for injection of 1290 nanometer wavelength light into the photodiode 400. As shown in FIG. 5B, the non-rectangular perimeter geometry of the germanium junction 405 guides light around in the germanium junction 405, which results in an increased efficiency of the photodiode 400.

In an example embodiment, the photodiode 400 is implemented in a photodetector. The photodiode 400 has the germanium junction 405 formed between the n-doped region 401 and the p-doped region 403. The germanium junction 405 is formed to have the light input interface 409. The light input interface 409 has a convex-faceted shape. The germanium junction 405 has a polygonal cross-sectional shape in the reference plane between the n-doped region 401 and the p-doped region 403. The polygonal cross-sectional shape of the germanium junction 405 includes at least one angle greater than ninety degrees. In some embodiments, the polygonal cross-sectional shape of the germanium junction 405 is configured to increase a travel path of incoming light within the germanium junction 405, where the incoming light enters through the light input interface 409. In some embodiments, the polygonal cross-sectional shape of the germanium junction 405 has a multi-faceted oval shape.

In some embodiments, the photodetector also includes the input waveguide 411 connected to the input interface 409 of the germanium junction 405. In some embodiments, the input waveguide 411 has the substantially linear shape along the lengthwise centerline 408 of the input waveguide 411. In some embodiments, the input waveguide 411 is oriented to so that the lengthwise centerline 408 of the input waveguide 411 is non-perpendicular to the convex-faceted shape of the input interface 409 of the germanium junction 405.

In some embodiments, the convex-faceted shape of the input interface 409 of the germanium junction 405 includes two facets, i.e., the first angled side 409B and the second angled side 409C. In some embodiments, the first facet 409B of the two facets has the first length L1 as measured in the reference plane between the n-doped region 401 and the p-doped region 403, and the second facet 409C of the two facets has the second length L2 as measured in the reference plane, where the first length L1 is greater than the second length L2. In some embodiments, the lengthwise centerline 408 of the input waveguide 411 is offset in the reference plane from the intersection point 409A of the two facets 409B and 409C. In some embodiments, the lengthwise centerline 408 of the input waveguide 411 intersects the first facet 409B.

The various embodiments of photodetectors and photodiodes disclosed herein include features that improve over conventional photodiode configurations. For example, in some embodiments, the input waveguide is oriented at an angle ($\alpha$) with respect to the light input interface of the germanium junction of the photodiode. Also, in some embodiments, the germanium junction is formed to have a non-flat light input interface (angled interface) relative to the incoming light propagation direction from the input waveguide. Also, in some embodiments, the germanium junction has a non-rectangular perimeter in cross-section taken parallel to the chip, which increases the optical travel length in the germanium junction. The various germanium photodetector embodiments disclosed herein provide numerous improvements over convention photodiode configurations, where the improvements include reduced optical reflections, reduced capacitance, reduced dark current, and reduced size, among others, with essentially no decrease in the responsivity of the photodetector.

The foregoing description of the embodiments has been provided for purposes of illustration and description, and is not intended to be exhaustive or limiting. Individual elements or features of a particular embodiment are generally not limited to that particular embodiment, but, where applicable, are interchangeable and can be used in a selected embodiment, even if not specifically shown or described. In this manner, one or more features from one or more embodiments disclosed herein can be combined with one or more features from one or more other embodiments disclosed herein to form another embodiment that is not explicitly disclosed herein, but rather that is implicitly disclosed herein. This other embodiment may also be varied in many ways. Such embodiment variations are not to be regarded as a departure from the disclosure herein, and all such embodiment variations and modifications are intended to be included within the scope of the disclosure provided herein.

Although some method operations may be described in a specific order herein, it should be understood that other housekeeping operations may be performed in between method operations, and/or method operations may be adjusted so that they occur at slightly different times or simultaneously or may be distributed in a system which allows the occurrence of the processing operations at various intervals associated with the processing, as long as the processing of the method operations are performed in a manner that provides for successful implementation of the method.

Although the foregoing embodiments have been described in some detail for purposes of clarity of understanding, it will be apparent that certain changes and modifications can be practiced within the scope of the appended claims. Accordingly, the embodiments disclosed herein are to be considered as illustrative and not restrictive, and are therefore not to be limited to just the details given herein, but may be modified within the scope and equivalents of the appended claims.

What is claimed is:

1. A photodetector, comprising:
a photodiode having a germanium junction formed between an n-doped region and a p-doped region, the germanium junction formed to have a light input interface, the light input interface having a convex-faceted shape, the germanium junction having a polygonal cross-sectional shape in a reference plane between the n-doped region and the p-doped region, the polygonal cross-sectional shape including at least one angle greater than ninety degrees.

2. The photodetector as recited in claim 1, wherein the polygonal cross-sectional shape is configured to increase a travel path of incoming light within the germanium junction, wherein the incoming light enters through the light input interface.

3. The photodetector as recited in claim 1, wherein the polygonal cross-sectional shape has a multi-faceted oval shape.

4. The photodetector as recited in claim 1, further comprising:
an input waveguide connected to the input interface of the germanium junction.

5. The photodetector as recited in claim 4, wherein the input waveguide has a substantially linear shape along a lengthwise centerline of the input waveguide.

6. The photodetector as recited in claim 5, wherein the input waveguide is oriented to so that the lengthwise centerline of the input waveguide is non-perpendicular to the convex-faceted shape of the input interface of the germanium junction.

7. The photodetector as recited in claim 6, wherein the convex-faceted shape of the input interface of the germanium junction includes two facets.

8. The photodetector as recited in claim 7, wherein a first facet of the two facets has a first length as measured in a reference plane between the n-doped region and the p-doped region, and a second facet of the two facets has a second length as measured in the reference plane, wherein the first length is greater than the second length.

9. The photodetector as recited in claim 8, wherein the lengthwise centerline of the input waveguide is offset in the reference plane from an intersection point of the two facets.

10. The photodetector as recited in claim 9, wherein the lengthwise centerline of the input waveguide intersects the first facet.

* * * * *